US006749119B2

(12) United States Patent
Scheible et al.

(10) Patent No.: US 6,749,119 B2
(45) Date of Patent: Jun. 15, 2004

(54) SYSTEM FOR A MACHINE HAVING A LARGE NUMBER OF PROXIMITY SENSORS, AS WELL AS A PROXIMITY SENSOR, AND A PRIMARY WINDING FOR THIS PURPOSE

(75) Inventors: Guntram Scheible, Hirschberg (DE); Bernd Smailus, Hemsbach (DE); Martin Klaus, Bensheim (DE); Kai Garrels, Mannheim (DE); Lothar Heinemann, Hirschberg (DE)

(73) Assignee: ABB Research Ltd., Zurich (CH)

( * ) Notice: Subject to any disclaimer, the term of this patent is extended or adjusted under 35 U.S.C. 154(b) by 39 days.

(21) Appl. No.: 10/014,000

(22) Filed: Dec. 11, 2001

(65) Prior Publication Data

US 2002/0105343 A1 Aug. 8, 2002

Related U.S. Application Data

(63) Continuation of application No. PCT/EP00/05137, filed on Jun. 6, 2000.

(30) Foreign Application Priority Data

Jun. 11, 1999 (DE) .......................................... 199 26 799
Jun. 26, 1999 (DE) .......................................... 199 29 344

(51) Int. Cl.$^7$ ................................................ G06K 7/08
(52) U.S. Cl. ...................................... 235/451; 235/493
(58) Field of Search ................................ 235/451, 492, 235/493, 449; 307/44, 83, 90, 413

(56) References Cited

U.S. PATENT DOCUMENTS 4,039,927 A * 8/1977 Richards, Jr. et al. ......... 323/17
4,571,487 A * 2/1986 Offermann .................. 219/482
5,034,658 A * 7/1991 Hierig et al. ................. 315/76
5,898,579 A * 4/1999 Boys et al. ................... 363/23
6,278,210 B1 * 8/2001 Fatula, Jr. et al. .......... 310/112
6,464,145 B1 * 10/2002 Chimura ...................... 235/492

FOREIGN PATENT DOCUMENTS

| DE | 44 42 677 A1 | 6/1996 |
| DE | 195 28 341 C1 | 10/1996 |
| DE | 197 35 624 C1 | 12/1998 |
| WO | WO 95/11544 | 4/1995 |
| WO | WO 98/43338 | 10/1998 |

OTHER PUBLICATIONS

Schöner, Jürgen et al.: "Dezentrale Versorgung aktiver Geber" [decentralized supply of active sender], radio fernsehen elektronik, vol. 41, 1992, No. 9, pp. 627–630.
Kawamura, Atsuo et al.: "Wireless Transmission of Power and Information through One High Frequency Resonant AC Link Inverter for Robot Manipulator Applications" Record of the Industry Applications Conference (IAS), New York, IEEE, vol. Conf. 30, Oct. 8, 1995, pp. 2367–2372.

* cited by examiner

Primary Examiner—Daniel St. Cyr
(74) Attorney, Agent, or Firm—Laurence A. Greenberg; Werner H. Stemer; Gregory L. Mayback

(57) ABSTRACT

A system for a machine, in particular an automated production machine, has a large number of proximity sensors. Each proximity sensor has at least one secondary winding that is suitable for drawing power from a medium-frequency magnetic field. At least one primary winding, which is fed from a medium-frequency oscillator, is provided for supplying the proximity sensors with electrical power without using wires. Each proximity sensor is equipped with a transmitting device that emits radio signals, which contain sensor information of interest, to a central receiving device that is connected to a process computer for the machine. A proximity sensor and a primary winding for this purpose are also proposed.

12 Claims, 6 Drawing Sheets

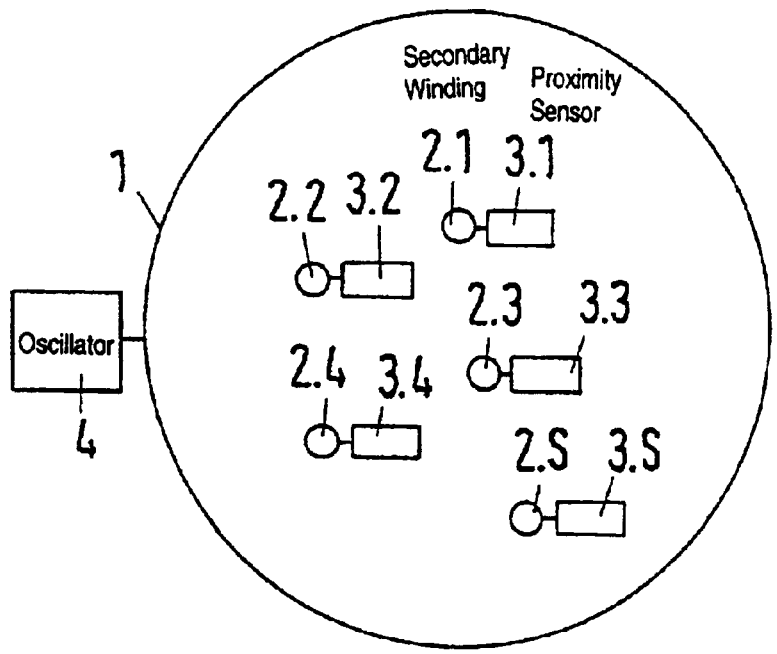
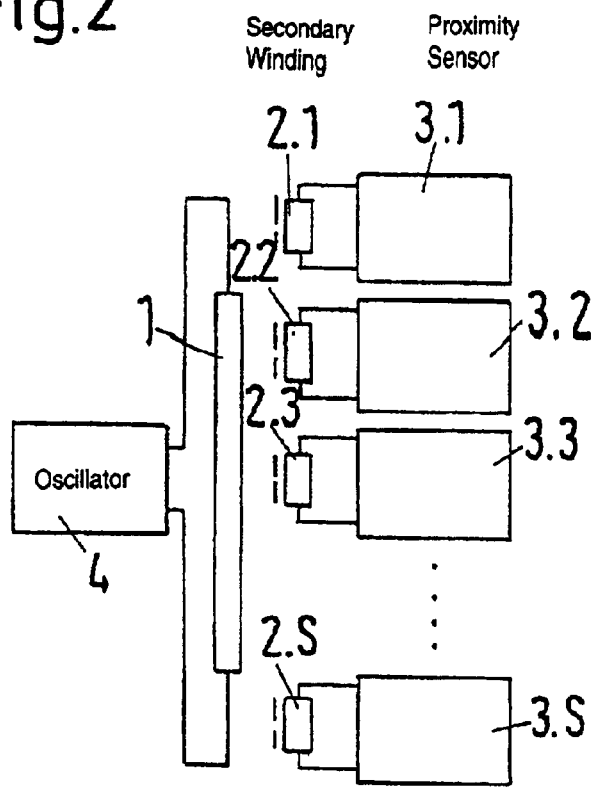

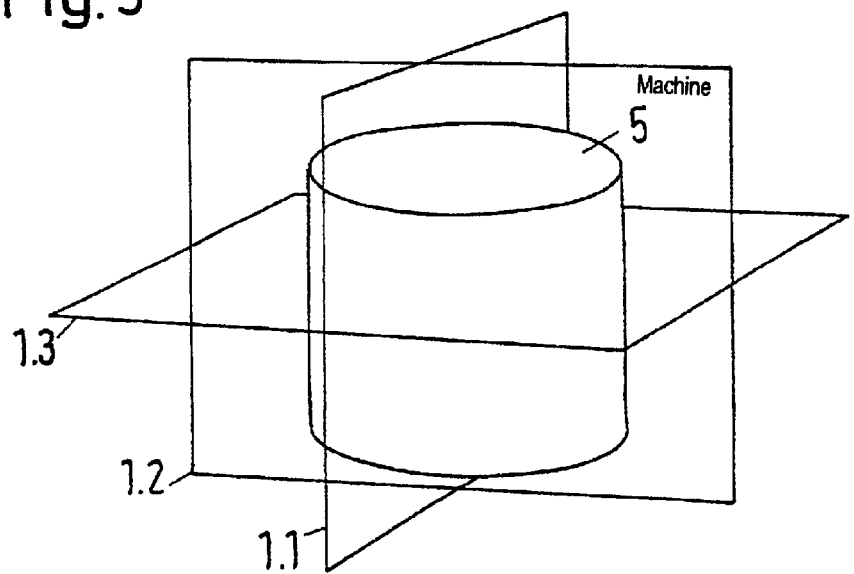
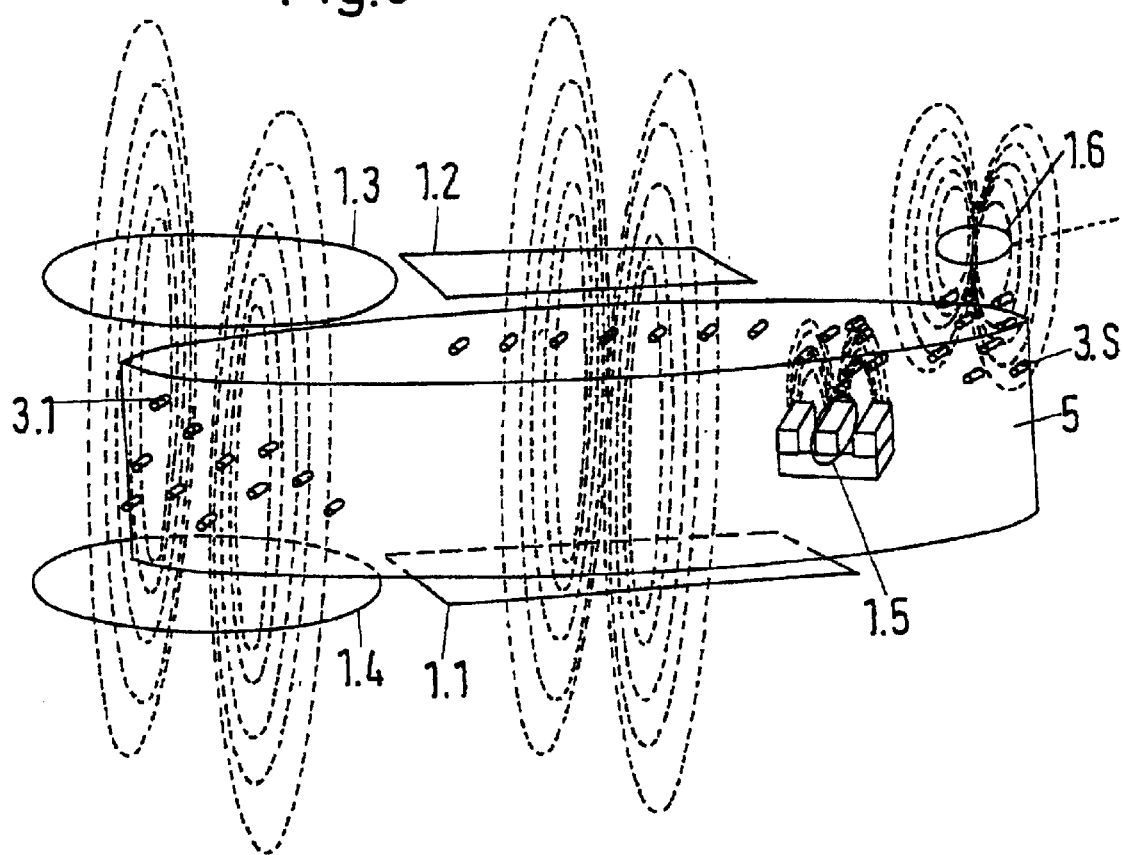

SYSTEM FOR A MACHINE HAVING A LARGE NUMBER OF PROXIMITY SENSORS, AS WELL AS A PROXIMITY SENSOR, AND A PRIMARY WINDING FOR THIS PURPOSE

CROSS-REFERENCE TO RELATED APPLICATION

This application is a continuation of copending International Application No. PCT/EP00/05137, filed Jun. 6, 2000, which designated the United States.

BACKGROUND OF THE INVENTION

Field of the Invention

The invention relates to a system for a machine having a large number of proximity sensors, as well as to a proximity sensor, and a primary winding for this purpose. The invention can be used for supplying electrical power to proximity sensors that are mounted on moving machine components (e.g. industrial robots, automatic production machines, and automated production machines).

A decentralized supply for a large number of transmitters utilizing inductive power transmission is known from Schoener J et al.: "Dezentrale Versorgung aktiver Geber" [Decentralized supply of active transmitters], Radio Fernsehen Elektronik, DE, VEB Verlag Technik, Berlin, Volume 41, No. 9, Sep. 1, 1992 (1992-09-01), pages 627–630, in conjunction with a system for position detection. A constant-frequency alternator that is installed on a crane operates at a fixed frequency of 100 to 130 kHz or more acting on a frame antenna that is tuned to resonance and transmits AC power to the compact assemblies installed in the transmitters, and which are likewise equipped with a frame antenna tuned to resonance. The induced voltage is rectified and feeds the compact assembly. The distance to be bridged is 150 mm. A power level of approximately 100 mW must be transmitted for one compact assembly.

German published, non-prosecuted patent application DE 44 42 677 A1 discloses a method and a configuration for supplying an electrical load with an electrical supply voltage or an electrical supply current. The configuration supplies the voltage or current via radio waves from a radio transmitter to a radio receiver that is electrically connected to the load. The radio receiver converts the radio waves to the electrical supply voltage or the electrical supply current. The radio waves can come from the electromagnetic high frequency range (radio waves) or also from the microwave range. The electrical loads can be, for example, power or voltage sensors.

SUMMARY OF THE INVENTION

It is accordingly an object of the invention to provide a system for a machine having a large number of proximity sensors, as well as a proximity sensor, and a primary winding for this purpose that overcomes the hereinafore-mentioned disadvantages of the heretofore-known devices of this general type and that specifies a cost-effective and reliable system for a machine having a large number of proximity sensors, which ensures that electrical power can be supplied to the proximity sensors without using wires. Furthermore, a proximity sensor that is suitable for this purpose will be proposed. In addition, a primary winding that is suitable for this purpose will be proposed.

With regard to the system, the object is achieved by a system for a machine, in particular an automated production machine, having a large number of proximity sensors. Each proximity sensor has at least one secondary winding that is suitable for drawing power from a medium-frequency magnetic field, with at least one primary winding that is fed from a medium-frequency oscillator being provided for supplying the proximity sensors with electrical power without using wires. Each proximity sensor is equipped with a transmitting device that emits radio signals, which contain sensor information of interest, to a central receiving device that is connected to a process computer for the machine.

With the foregoing and other objects in view, there is provided, in accordance with the invention, a system for a machine. The system includes a proximity sensor generating sensor information. A transmitting device transmits the sensor information from the proximity sensor and emitting radio signals containing the sensor information to a central receiving device connected to a process computer for the machine. A secondary winding connects to the proximity sensor for drawing power from a medium-frequency magnetic field. A primary winding is fed from a medium-frequency oscillator. The primary winding is provided for supplying the proximity sensor with electrical power without requiring wires.

With the objects of the invention in view, there is also provided a primary winding including a connection element and a plurality of parallel conductors. The plurality of parallel conductors forms a plurality of separate winding sections, the plurality of separate winding sections are mechanically and electrically connected to one another via the connection element.

With the objects of the invention in view, there is also provided a primary winding. The primary winding includes a number of parallel conductors forming a flexible cable with two cable ends being offset with respect to one another. A connection element electrically and mechanically connecting the two cable ends to one another. Connection lines are connected to the cable ends via the connection element and forming two free winding ends.

With regard to the proximity sensor, the object is achieved by a proximity sensor having a number of secondary windings that are suitable for drawing power from a medium-frequency magnetic field.

The medium-frequency oscillations that are of interest in this context are understood to be those in the range from about 15 kHz to about 15 MHz.

With regard to the primary winding, the object is achieved by a primary winding including a number of separate winding sections. Each of the winding sections is formed from a number of parallel conductors. The individual winding sections are mechanically and electrically connected to one another via connection elements. If one connection element electrically connects two winding sections to one another, the two winding sections are offset with respect to one another, thus forming two free winding ends that are suitable for connection of connection lines to a generator or oscillator.

An alternative embodiment of the primary winding achieves the object by including a primary winding having a flexible cable formed from a number of parallel conductors and a connection element that electrically and mechanically connects the two cable ends to one another. The parallel conductors are offset with respect to one another. Thus, two free winding ends are formed that are suitable for connection of connection lines to a generator or oscillator.

The invention achieves the following advantages. Compared to conventional solutions with a cable connection for supplying electrical power to the proximity sensors, the invention avoids the relatively high cost factor resulting from planning, material, installation, documentation, and maintenance, for a cable connection. In addition, no failures can occur due to cable breaks or poor contacts, for example corroded contacts.

Compared to batteries for supplying power to proximity sensors, no maintenance effort or cost is lost for replacing the batteries. Sometimes, the costs are exacerbated when the batteries are in poorly accessible locations.

In the stated medium-frequency range (from about 15 kHz to about 15 MHz), the disadvantages that result from skin effects, for example the losses that occur, are still manageable. No electromagnetic waves are emitted, because the primary windings are too small in comparison to the wavelengths that occur. Therefore, the primary windings do not act as antennas. This allows the configurations to be constructed in a simple manner. There is no need to conduct EMC measurements on any radiated interference. A further advantageous factor is that medium-frequency magnetic fields are shielded only to a minor extent by metallic machine components so that a magnetic field that is sufficiently powerful to supply power is advantageously produced even at inaccessible points in a machine.

Other features which are considered as characteristic for the invention are set forth in the appended claims.

Although the invention is illustrated and described herein as embodied in a system for a machine having a large number of proximity sensors, as well as a proximity sensor, and a primary winding for this purpose, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is an outline circuit diagram showing the configuration for supplying electrical power to proximity sensors without using wires;

FIG. 2 is a circuit diagram showing the transformer and related principle that is used;

FIG. 5 is a perspective view showing a third embodiment of a system with orthogonal primary windings;

FIG. 6 is a perspective view showing a fourth, physically extended embodiment of the system with primary windings of different configurations;

DESCRIPTION OF THE PREFERRED EMBODIMENTS

Figure 3:
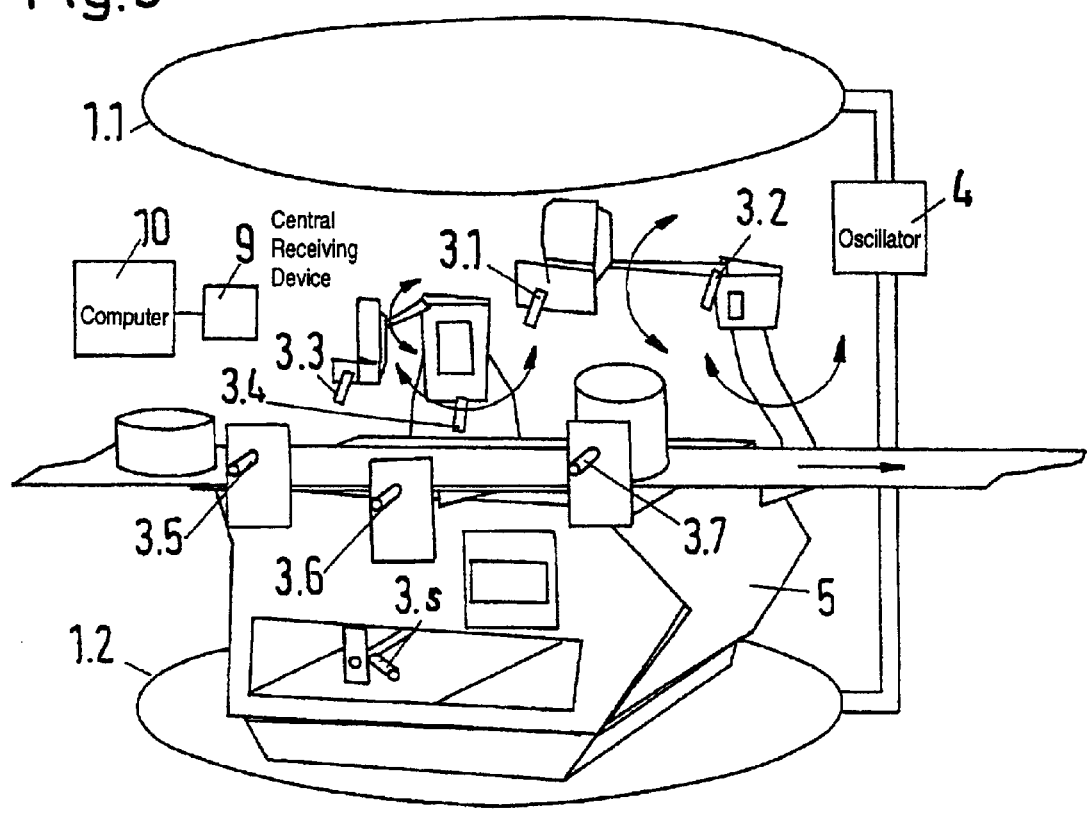
FIG. 3 is a perspective view showing a first preferred embodiment of the system.

Referring now to the figures of the drawings in detail and first, particularly to FIG. 1 thereof, there is shown an outline circuit diagram of the configuration for supplying electrical power to proximity sensors without using wires. A circular primary winding 1 can be seen that is preferably formed from a number of turns and has a large number—possibly up to several hundred—of secondary windings 2.1, 2.2, 2.3 . . . 2.s (s=any desired integer), with each secondary winding 2.1, 2.2, 2.3 . . . 2.s being connected respectively to a proximity sensor 3.1, 3.2, 3.3 . . . 3.s. The primary winding 1 is connected to an oscillator 4 (i.e., a medium-frequency oscillator). The oscillator 4 feeds a medium-frequency oscillation in the range from about 15 kHz to about 15 MHz to the primary winding 1. This medium frequency would lead to the emission of electromagnetic fields, but at wavelengths of more than 22 m to 22 km, which are thus considerably greater than the dimensions of the primary winding used—less than 2 m—so that the primary winding does not act as an antenna for such electromagnetic radiation. The coupling between the primary winding and the secondary windings is thus purely magnetic (without any effective electromagnetic coupling) in the sense of a medium-frequency transformer.

The power consumption of a proximity sensor is in the order of magnitude from a few tens of microwatts up to about 50 milliwatts, preferably around 1 milliwatt.

FIG. 2 shows a circuit diagram to explain the transformer principle that is used. This once again shows the primary winding 1 with the feeding oscillator 4 and the proximity sensors 3.1 . . . 3.s with the connected secondary windings 2.1 . . . 2.s.

FIG. 3 shows a first preferred embodiment. This shows a machine 5—in particular an industrial robot, automatic production machine, or automated production machine—which is provided with numerous proximity sensors 3.1 . . . 3.s mounted on moving machine components.

The machine 5 is located between two horizontally disposed primary windings 1.1 and 1.2. These two primary windings 1.1 and 1.2 are fed electrically in parallel from the oscillator 4 (generator) or, alternatively, are fed from two separate oscillators. A relatively uniform magnetic field is formed between the two primary windings. The important factor in this case is that the proximity sensors are always located in the magnetic field formed between the two primary windings 1.1, 1.2, so that they are magnetically coupled via their secondary windings (which are illustrated in FIG. 3), and can thus be fed with power.

Each proximity sensor 3.1 . . . 3.s is equipped with a transmitting device which emits radio signals relating to the detected sensor information of interest, in particular the "object to be detected present/not present" proximity state. The radio signals from all the proximity sensors are received by a central receiving device 9, and are passed on to a process computer 10 (programmable logic controller). The receiving device 9 is preferably located in the immediate vicinity of the machine 5, in order to ensure an optimum radio link to the proximity sensors, while the process computer 10 that controls the machine may also be disposed at a distance from the machine 5. As can easily be seen, the proposed system results in the proximity sensors being configured without any cables either to supply them with electrical power or to transmit information to the process computer.

As an extension to the proposed system, the proximity sensors 3.1 . . . 3.s are provided with receiving devices which receive radio signals from a central transmitting device 9. This allows bidirectional information interchange between the process computer and the proximity sensors, with transmitting/receiving devices in each case having to be provided for the radio signals.

Figure 4:
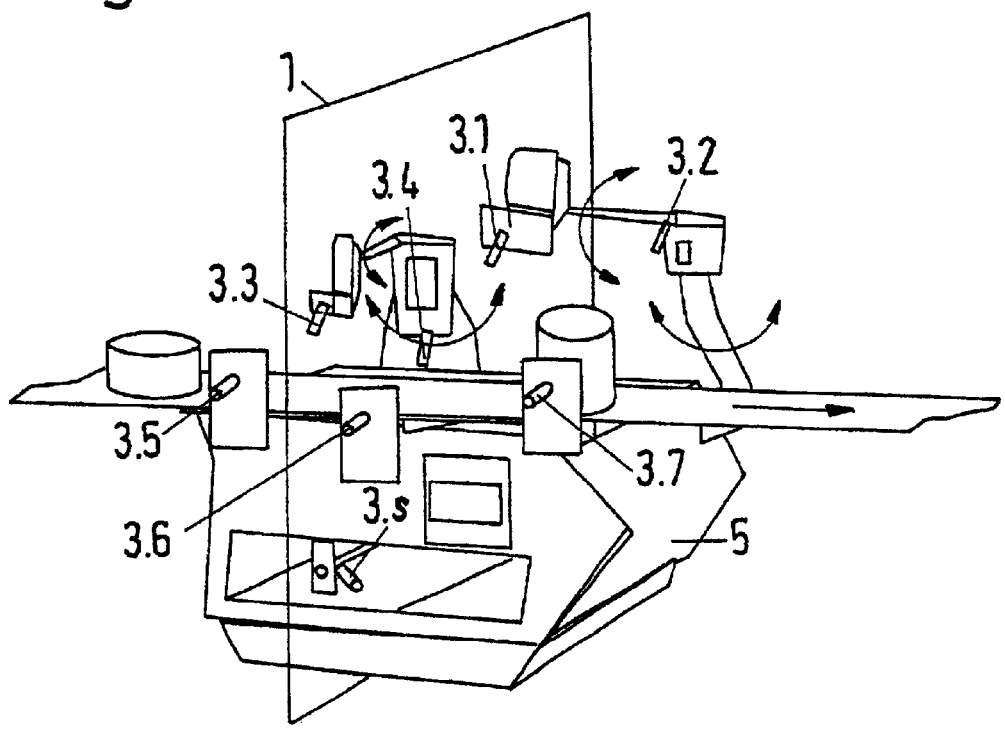
FIG. 4 is a perspective view showing a second preferred embodiment of the system having a single primary winding.

FIG. 4 shows a second preferred embodiment. In this embodiment, only a single primary winding 1 covers the machine 5—in particular an industrial robot, automatic production machine, or automated production machine—globally together with the numerous proximity sensors 3.1 . . . 3.s mounted on it.

FIG. 5 shows a third embodiment with three primary windings 1.1, 1.2, and 1.3 disposed at right angles to one another. A machine 5 is shown which is surrounded by a first vertical primary winding 1.1, a second vertical primary winding 1.2 at right angles to it, and a horizontal third primary winding 1.3. This embodiment with three orthogonal primary windings results in a particularly uniform magnetic field, with no directional effect. Alternatively or in addition to this, it is also possible to equip each proximity sensor 3.1 . . . 3.s with two or three orthogonal secondary windings.

Furthermore, an embodiment is also feasible in which only two orthogonal primary windings are provided.

Embodiments are, of course, also feasible that have a number of primary windings 1.1 to 1.p, which are not necessarily disposed at right angles.

FIG. 6 shows a fourth embodiment with a number of primary windings of different configurations. This is a relatively physically extended machine 5, in which the individual proximity sensors 3.1 . . . 3.s are not disposed such that they are distributed, so to speak, homogeneously over the machine, but occur as groups only at a number of specific areas in the machine. In such a physically extended configuration, the use of a number of specifically disposed primary windings is advantageous, for reasons relating to the magnetic field strength that is to be achieved, which each locally influence at least one secondary winding of a proximity sensor.

A first machine area that is fitted with proximity sensors is in this case located in the magnetic field between two horizontal, rectangular, mutually opposite primary windings 1.1, 1.2. A second machine area, which is adjacent to the former and is fitted with proximity sensors, is located in the magnetic field between two horizontal, annular or oval, mutually opposite primary windings 1.3, 1.4. A third machine area that is fitted with proximity sensors is influenced by the magnetic field of a primary winding 1.5, this primary winding being disposed around the center limb of an E-shaped ferrite core, thus partially shielding the magnetic field and partially amplifying it in the locally limited area of interest (spot effect). A fourth machine area that is fitted with proximity sensors is in the area influenced by a primary winding 1.6. The magnetic fields of the individual primary windings 1.1 to 1.6 are each indicated by dashed lines in the individual machine areas.

Figure 7:
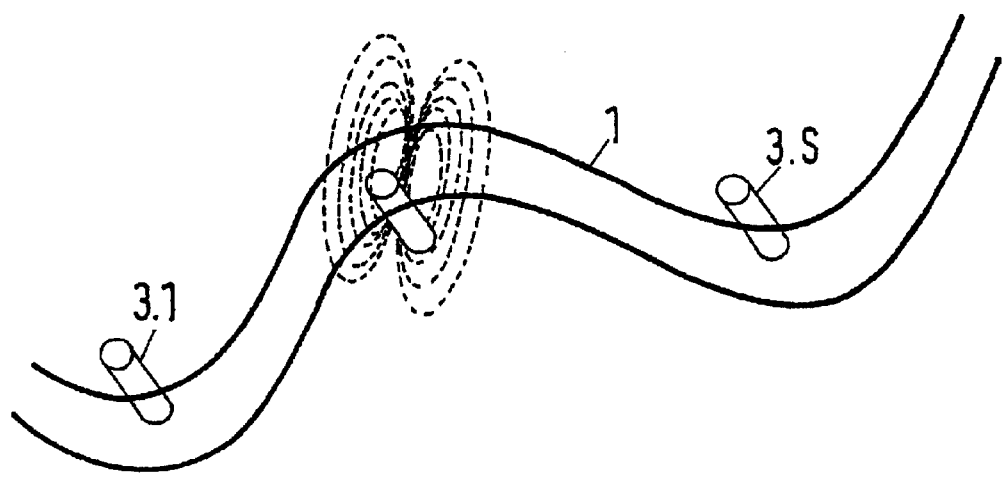
FIG. 7 is a diagrammatic view showing a fifth embodiment with a primary winding in the form of a strip.

FIG. 7 shows a fifth embodiment with a primary winding in the form of a strip. The primary winding 1 in the form of a strip is connected at its first end to the oscillator 4, while the other end is interconnected. This results in a double line with two conductors through which the same current flows in opposite directions, which amplifies the magnetic field between the two conductors in a desirable manner, while attenuating the magnetic field in the area outside the two conductors. The primary winding 1 in the form of a strip is advantageously installed on the machine in such a manner that the individual proximity sensors 3.1 to 3.n are located in the area between the two conductors of the double line.

Each line of the double line may, of course, in this case include a number of individual conductors, the individual conductors in the two lines being connected to one another in the form of a winding, thus effectively resulting in a primary winding 1 as described with reference to FIG. 4, which is extremely flat.

Figure 8:
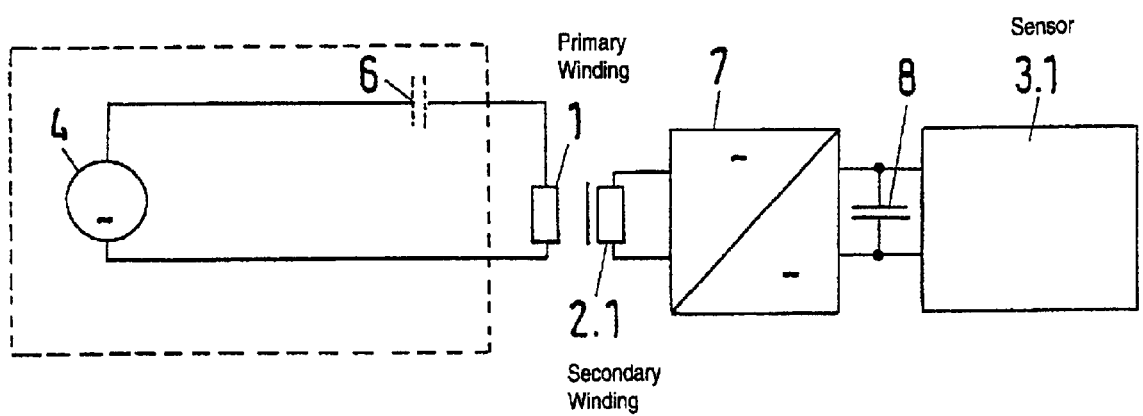
FIG. 8 is a partial diagrammatic and partial block view showing an equivalent circuit with developments on the primary and secondary sides.

FIG. 8 shows an equivalent circuit with developments on the primary and secondary sides. As can be seen, the primary winding 1 is connected via a compensation capacitor 6 to the oscillator 4, thus ensuring that the oscillator is operated at resonance. The magnetic coupling between the primary winding 1 and the secondary winding 2.1 is indicated only by way of example. An AC/DC controller 7 is connected to the secondary winding 2.1 and feeds an energy store 8, which is used for supplying power to the sensor 3.1.

As an extension to the circuit diagram illustrated in FIG. 8, it is also possible to provide a compensation capacitor in the connecting line between the secondary winding 2.1 and the AC/DC controller 7.

Windings are normally produced by winding a desired number of turns of a conductor. In the case of large-area windings, difficulties can arise, for example in subsequent integration of a relatively large primary winding in automatic or automated production machines or, in general, in any machine. The expression "relatively large" means that the primary winding is approximately the same size as the automatic production machine itself.

Sixth, seventh, and eighth embodiments of primary windings are specified in the following text, which can even be integrated retrospectively in a system or machine, without any difficulties.

In this case, the primary winding may include a number of separate winding sections, each of which is formed from a number of parallel conductors, with the individual winding sections being mechanically and electrically connected to one another via connection elements, and, if there is one connection element, with two winding sections being electrically connected to one another, offset with respect to one another, thus forming two free winding ends which are suitable for connection of connection lines to a generator or oscillator.

As an alternative to this, the primary winding may include a flexible cable, formed from a number of parallel conductors, and a connection element that electrically and mechanically connects the two cable ends to one another, offset with respect to one another, thus forming two free winding ends which are suitable for connection of connection lines to a generator or oscillator.

The advantages that can be achieved by the sixth, seventh, and eighth embodiments are, in particular, that the primary winding can be disconnected. Disconnectability makes it possible to install the proposed primary winding retrospectively in a machine in a simple manner. The primary winding is produced only in the machine itself by connecting the individual winding sections or the flexible cable using the at least one connection element, so that exact matching to the machine can be achieved with the number and position of the connection elements and by flexible configuration of the winding sections. These sections are preferably composed of flexible flat ribbon cable. The use of flat ribbon cable has the further advantage that the magnetic field produced by the primary winding has a relatively broad axial extent, thus improving the magnetic coupling to further windings.

Figure 9:
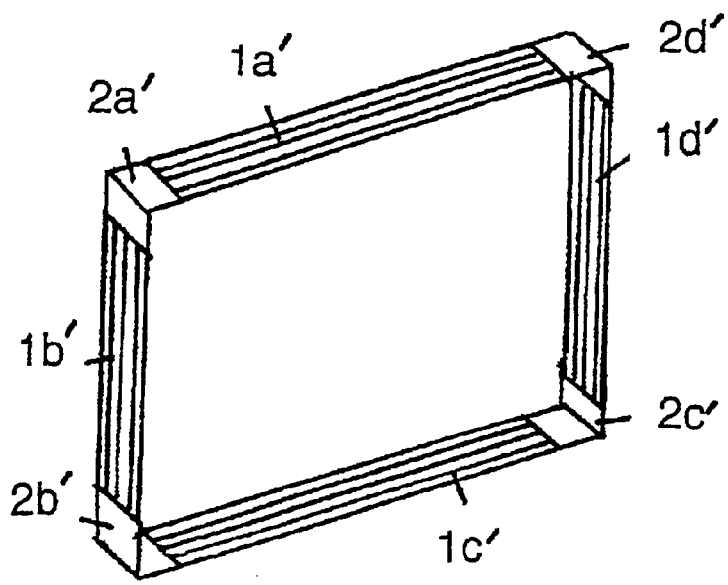
FIG. 9 is a perspective view of a sixth embodiment of a primary winding.

FIG. 9 shows a sixth embodiment of a primary winding. This sixth embodiment is particularly suitable for a vertical configuration of the primary winding. The rectangular primary winding has four separate winding sections $1a'$, $1b'$, $1c'$, $1d'$ that are electrically and mechanically connected to one another at the four corners via connection elements $2a'$, $2b'$, $2c'$, $2d'$. Flexible, multicore flat ribbon cables with a number of parallel conductors are preferably used for the winding sections $1a'$ to $1d'$.

Figure 10:
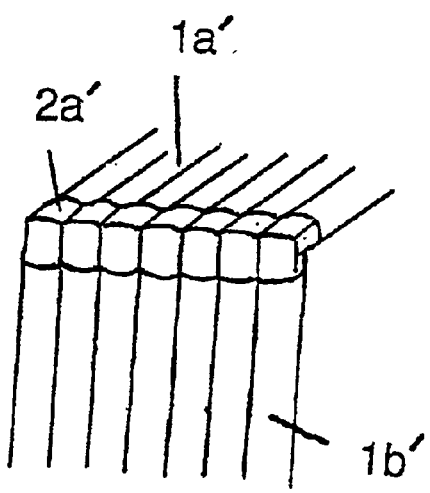
FIG. 10 is a detailed perspective view showing one corner of a primary winding in the sixth embodiment shown in FIG. 9.

FIG. 10 shows a detailed view of one corner of the sixth embodiment of a primary winding. The illustrated connection element $2a'$ has seven angled contact points, which are disposed alongside one another in a row, are electrically insulated from one another, and each have two connections for the two winding sections $1a'$, $1b'$. The contact points, which are disposed alongside one another, are angled in two planes.

In order to make electrical contact, these contact points have, for example, openings with contact tongues, into which the electrical conductors of the winding sections are inserted.

Figure 11:
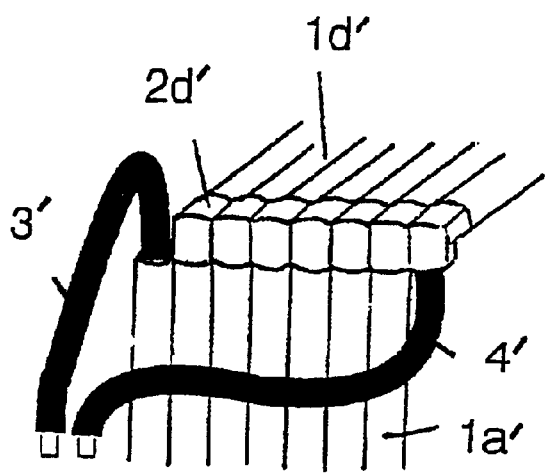
FIG. 11 is detailed perspective view showing the winding feed in the sixth embodiment.

FIG. 11 shows a detailed view of the winding feed for the sixth embodiment. As can be seen, the two winding sections $1a'$, $1d'$ are inserted into the connection element $2d'$ offset with respect to one another. The respective free ends of the winding section $1a'$ and of the winding section $1d'$ form the winding ends, and make contact with a respective connection line $3'$ or $4'$, the other ends of which are connected to a generator or oscillator. The contact between the connection line $4'$ and the winding section $1d'$ is provided via the connection element $2d'$. The further electrical connection between the connection line $3'$ and the winding section $1a'$ is produced, for example, by soldering.

As an alternative, it is also possible to use, at the winding feed, a connection element that has one more contact point than the number of parallel conductors in a winding section (i.e., $n_{cp} \geq n_{pc}+1$). Both the contacts between the connection lines $3'$, $4'$ and the winding sections can then be made via the connection element itself.

The further connection elements $2b'$, $2c'$ of the primary winding are connected to the winding sections in the manner illustrated in FIG. 10. Overall, this results in a primary winding with seven turns.

Figure 12:
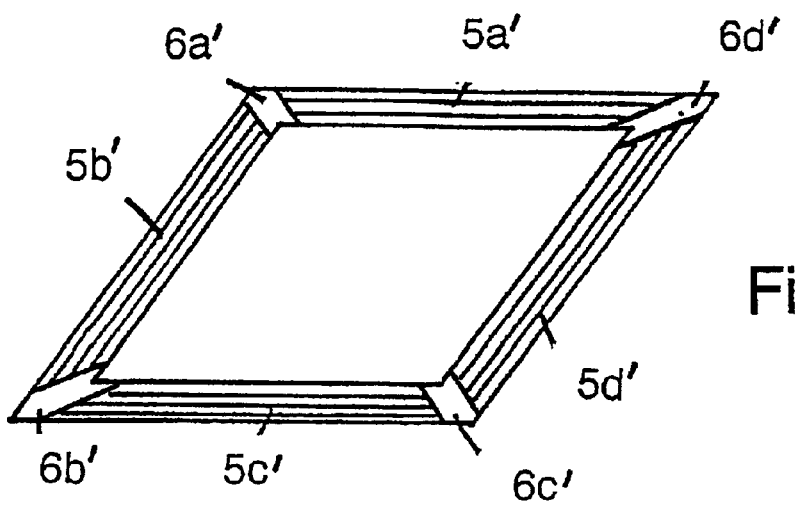
FIG. 12 is a perspective view showing a seventh embodiment of a primary winding.

FIG. 12 shows a seventh embodiment of a primary winding. This seventh embodiment is particularly suitable for a horizontal configuration of the primary winding. The rectangular primary winding has four separate winding sections $5a'$, $5b'$, $5c'$, $5d'$, which are electrically and mechanically connected to one another at the four corners via connection elements $6a'$, $6b'$, $6c'$, $6d'$. Multicore flat ribbon cable is preferably used for the winding sections $5a'$ to $5d'$.

Figure 13:
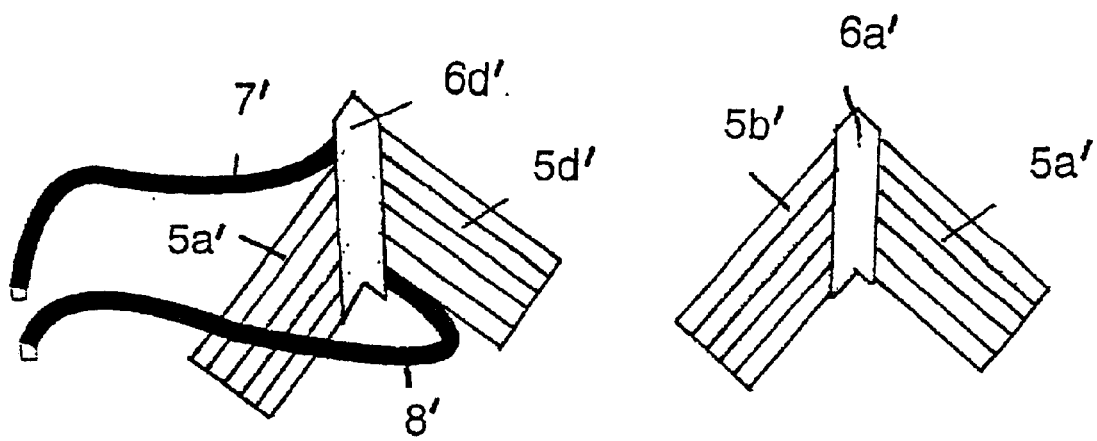
FIG. 13 is a detailed, partial perspective view of the winding feed in the seventh embodiment shown in FIG. 12.

FIG. 13 shows a detailed view of the winding feed in the seventh embodiment. In order to make electrical contact, the connection elements once again have openings with contact tongues, into which the electrical conductors of the winding sections are inserted. As can be seen, the two winding sections $5a'$, $5d'$ are inserted into the connection element $6d'$ offset with respect to one another. The respective free ends of the winding section $5a'$ and of the winding section $5d'$ form the winding ends, and make contact with a respective connection line $8'$ or $7'$, which are connected to a generator or oscillator at the other end. Because a connection element $6d'$ is used that has one more contact pair than the number of parallel conductors in the winding sections, the contact between the connection line $7'$ and the winding section $5d'$ and the contact between the connection line $8'$ and the winding section $5a'$, are made via the connection element $6d'$.

Figure 14:
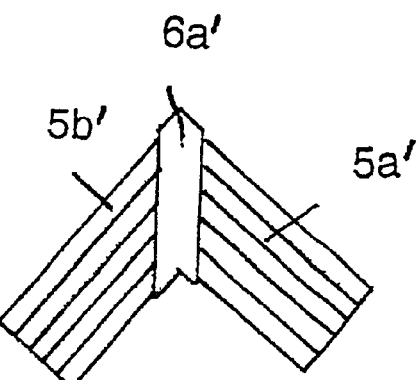
FIG. 14 is a detailed, partial perspective view of the winding in the seventh embodiment shown in FIG. 12.

FIG. 14 shows a detailed view of one corner of a primary winding in the seventh embodiment. The illustrated connection element $6a'$ has five angled contact points, which are disposed alongside one another in a row, and are electrically insulated from one another for the two winding sections $5a'$, $5b'$, with the contact points which are disposed alongside one another being angled in one plane. The further winding sections are electrically and mechanically connected via the connection elements $6b'$ and $6c'$ in the same manner.

As stated, multicore flexible flat ribbon cable is preferably used for the winding sections $1a'$ to $1d'$ and $5a'$ to $5d'$. As an alternative to this, particularly in order to form a very high-power primary winding carrying a relatively large current, a number of rigid conductor bars can form the winding sections. The rigid conductor bars must be disposed alongside one another and must be electrically insulated from one another.

Rectangular configurations of the primary winding have been described above, and these necessitate the use of connection elements with contact points bent at right angles. In addition to these, other winding configurations (i.e., triangular, pentagonal, etc) are encompassed by the invention as well.

Figure 15:
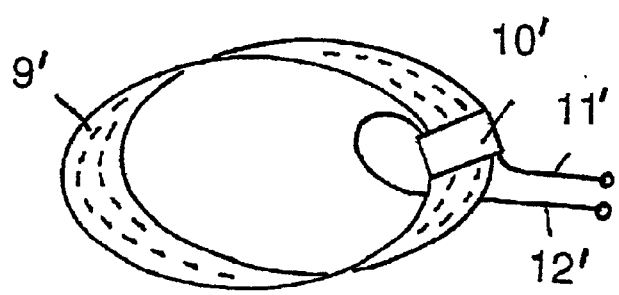
FIG. 15 is a perspective view of the eighth embodiment of a primary winding.

In the simplest case, a primary winding can be produced including a flexible cable $9'$, in particular a flat ribbon cable, and a single connection element $10'$, with the two ends of the cable being electrically connected to one another via the single connection element $10'$. The two ends are offset with respect to one another, thus resulting in free winding ends, which are suitable for connection of connection lines $11'$, $12'$ to a generator or oscillator. A primary winding such as this is shown in FIG. 15.

We claim:

1. A system for a machine, comprising:
   a proximity sensor generating sensor information;
   a transmitting device transmitting the sensor information from said proximity sensor and emitting radio signals containing the sensor information to a central receiving device connected to a process computer for the machine;
   a secondary winding connected to said proximity sensor for drawing power from a medium-frequency magnetic field;
   a medium-frequency oscillator; and
   a primary winding being fed from said medium-frequency oscillator, and provided for supplying said proximity sensor with electrical power without requiring wires.

2. The system according to claim 1, wherein said machine is an automated production machine.

3. The system according to claim 1, including:
   a plurality of said secondary windings; and
   only one of said single primary windings globally covering said plurality of secondary windings.

4. The system according to claim 1, including two primary windings being disposed parallel and alongside one another, and sandwiching said secondary winding.

5. The system according to claim 1, including two primary windings disposed at right angles to one another.

6. The system as claimed in claim 1, including three primary windings disposed at right angles to one another.

7. The system according to claim 1, wherein said proximity winding locally influences said secondary winding of said proximity sensor.

8. The system according to claim 1, wherein said primary winding includes a double line and said double line bounds said secondary windings of said proximity sensors.

9. The system according to claim 1, wherein said primary winding has a ferrite core.

10. The system according to claim 1, including a compensation capacitor connected to said primary winding.

11. The system according to claim 1, including a receiving device connected to said proximity sensor for receiving radio signals from a central transmitting device connected to the process computer.

12. The system according to claim 11, wherein said proximity sensor interchanges information bidirectionally with the process computer.

* * * * *